US012805107B2

(12) United States Patent
Chen et al.

(10) Patent No.: US 12,805,107 B2
(45) Date of Patent: Nov. 17, 2026

(54) SOLAR CELL SEMICONDUCTOR MICROCAVITY

(71) Applicants: Honda Motor Co., Ltd., Tokyo (JP); Utah State University, Logan, UT (US)

(72) Inventors: Gugang Chen, Palo Alto, CA (US); Yi Rao, Logan, UT (US)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 18/420,723

(22) Filed: Jan. 23, 2024

(65) Prior Publication Data

US 2025/0241108 A1 Jul. 24, 2025

(51) Int. Cl.

| | |
|---|---|
| ***H10K 30/50*** | (2023.01) |
| ***H10K 71/10*** | (2023.01) |
| ***H10K 85/60*** | (2023.01) |

(52) U.S. Cl.

CPC ............. *H10K 30/50* (2023.02); *H10K 71/10* (2023.02); *H10K 85/624* (2023.02)

(58) Field of Classification Search

CPC ........ H10F 77/45; H10F 77/12; H10F 77/122; H10F 77/124; H01L 25/167; H10K 30/00; H10K 30/15; H10K 30/87; H10K 50/11; H10K 50/115; H10K 50/125; H10K 85/111; H10K 85/30; H10K 85/621; H10K 85/622; H10K 85/623

See application file for complete search history.

(56) References Cited

U.S. PATENT DOCUMENTS

| | | | | |
|---|---|---|---|---|
| 2006/0249202 A1* | 11/2006 | Yoo | B82Y 10/00 | 136/263 |
| 2010/0193011 A1* | 8/2010 | Mapel | H10F 77/488 | 136/246 |
| 2010/0294344 A1* | 11/2010 | Huang | B29C 45/14811 | 977/932 |
| 2011/0192453 A1* | 8/2011 | DeGroot | H10F 77/1694 | 438/57 |
| 2014/0124740 A1* | 5/2014 | Chow | H10K 71/40 | 257/E51.025 |
| 2014/0124801 A1* | 5/2014 | Lee | H01L 25/0753 | 257/88 |
| 2017/0084853 A1* | 3/2017 | Afzali-Ardakani | H10K 30/10 | |

(Continued)

OTHER PUBLICATIONS

Tayebjee, M. J. Y.; Gray-Weale, A. A.; Schmidt, T. W., Thermodynamic Limit of Exciton Fission Solar Cell Efficiency. J. Phys. Chem. Lett. 2012, 3 (19), 2749-2754.

(Continued)

*Primary Examiner* — Thanh Truc Trinh

(74) *Attorney, Agent, or Firm* — Patterson + Sheridan, LLP

(57) ABSTRACT

Aspects of the present disclosure generally relate to a solar cell semiconductor substrate and methods of use. The solar cell semiconductor substrate described herein includes a base, an adhesion layer disposed on the base, a first reflective layer disposed on the adhesion layer, and a second reflective layer. A solar cell material including a polyacene having at least six carbon rings is disposed between the first reflective layer and the second reflective layer. The solar cell material has a thickness that is from about 100 nm to about 500 nm.

10 Claims, 7 Drawing Sheets

(56) References Cited

U.S. PATENT DOCUMENTS

2018/0258217 A1* 9/2018 Campos ............... H10K 85/623

OTHER PUBLICATIONS

Merrifield, R. E., Magnetic effects on triplet exciton interactions. Pure Appl. Chem. 1971, 27 (3), 481-498.
Geacintov, N. E.; Binder, M.; Swenberg, C. E.; Pope, M., Exciton dynamics in a-particle tracks in organic crystals: Magnetic field study of the scintillation in tetracene crystals. Phys. Rev. B 1975, 12 (10), 4113-4134.
Congreve, D. N.; Lee, J.; Thompson, N. J.; Hontz, E.; Yost, S. R.; Reusswig, P. D.; Bahlke, M. E.; Reineke, S.; Van Voorhis, T.; Baldo, M. A., External quantum efficiency above 100% in a singlet-exciton-fission-based organic photovoltaic cell. Science 2013, 340 (6130), 334-7.
Hestand, N. J.; Yamagata, H.; Xu, B.; Sun, D.; Zhong, Y.; Harutyunyan, A. R.; Chen, G.; Dai, H.-L.; Rao, Y.; Spano, F. C., Polarized Absorption in Crystalline Pentacene: Theory vs Experiment. J. Phys. Chem. C 2015, 119 (38), 22137-22147.
Qian, Y.; Li, X.; Harutyunyan, A. R.; Chen, G.; Rao, Y.; Chen, H., Herzberg-Teller Effect on the Vibrationally Resolved Absorption Spectra of Single-Crystalline Pentacene at Finite Temperatures. J. Phys. Chem. A 2020, 124 (44), 9156-9165.
Deng, G. H.; Qian, Y.; Li, X.; Zhang, T.; Jiang, W.; Harutyunyan, A. R.; Chen, G.; Chen, H.; Rao, Y., Singlet Fission Driven by Anisotropic Vibronic Coupling in Single-Crystalline Pentacene. J. Phys. Chem. Lett. 2021, 12 (12), 3142-3150.
Sun, D.; Deng, G. H.; Xu, B.; Xu, E.; Li, X.; Wu, Y.; Qian, Y.; Zhong, Y.; Nuckolls, C.; Harutyunyan, A. R.; Dai, H. L.; Chen, G.; Chen, H.; Rao, Y., Anisotropic Singlet Fission in Single Crystalline Hexacene. iScience 2019, 19, 1079-1089.
Monahan, N. R.; Sun, D.; Tamura, H.; Williams, K. W.; Xu, B.; Zhong, Y.; Kumar, B.; Nuckolls, C.; Harutyunyan, A. R.; Chen, G.; Dai, H. L.; Beljonne, D.; Rao, Y.; Zhu, X. Y., Dynamics of the triplet-pair state reveals the likely coexistence of coherent and incoherent singlet fission in crystalline hexacene. Nat Chem 2017, 9 (4), 341-346.
Qian, Y.; Huang-Fu, Z.-C.; Zhang, T.; Li, X.; Harutyunyan, A. R.; Chen, G.; Chen, H.; Rao, Y., Temperature-Dependent Recombination of Triplet Biexcitons in Singlet Fission of Hexacene. J. Phys. Chem. C 2022, 126 (19), 8377-8383.
Han, J.; Xie, Q.; Luo, J.; Deng, G. H.; Qian, Y.; Sun, D.; Harutyunyan, A. R.; Chen, G.; Rao, Y., Anisotropic Geminate and Non-Geminate Recombination of Triplet Excitons in Singlet Fission of Single Crystalline Hexacene. J. Phys. Chem. Lett. 2020, 11 (4), 1261-1267.
Qian, Y.; Zhang, T.; Li, X.; Rao, Y.; Chen, H., Herzberg-Teller Effect in Single-Crystalline Hexacene at Finite Temperatures. J. Phys. Chem. C 2022, 126 (7), 3366-3374.
Smith, M. B.; Michl, J., Singlet fission. Chem. Rev. 2010, 110 (11), 6891-936.
Baldacchino, A. J.; Collins, M. I.; Nielsen, M. P.; Schmidt, T. W.; McCamey, D. R.; Tayebjee, M. J. Y., Singlet fission photovoltaics: Progress and promising pathways. Chem. Phys. Rev. 2022, 3 (2), 021304.
Nozik, A. J., Quantization effects in semiconductor nanostructures and singlet fission in molecular chromophores for photovoltaics and solar fuels. Chem. Phys. Rev. 2021, 2 (2), 021305.
Gray, V.; Allardice, J. R.; Zhang, Z.; Rao, A., Organic-quantum dot hybrid interfaces and their role in photon fission/fusion applications. Chem. Phys. Rev. 2021, 2 (3), 031305.
Ribeiro, R. F.; Martinez-Martinez, L. A.; Du, M.; Campos-Gonzalez-Angulo, J.; Yuen-Zhou, J., Polariton chemistry: controlling molecular dynamics with optical cavities. Chem. Sci. 2018, 9 (30), 6325-6339.
Martinez-Martinez, L. A.; Du, M.; R, F. R.; Kena-Cohen, S.; Yuen-Zhou, J., Polariton-Assisted Singlet Fission in Acene Aggregates. J. Phys. Chem. Lett. 2018, 9 (8), 1951-1957.
Ebbesen, T. W., Hybrid Light-Matter States in a Molecular and Material Science Perspective. Acc. Chem. Res. 2016, 49 (11), 2403-2412.
Golombek, A.; Balasubrahmaniyam, M.; Kaeek, M.; Hadar, K.; Schwartz, T., Collective Rayleigh Scattering from Molecular Ensembles under Strong Coupling. J. Phys. Chem. Lett. 2020, 11 (10), 3803-3808.

* cited by examiner

SOLAR CELL SEMICONDUCTOR MICROCAVITY

FIELD

Aspects of the present disclosure generally relate to a solar cell semiconductor substrate and methods of use.

BACKGROUND

Singlet fission (SF) involves the process of generating two triplet excitons from one incident photon, overcoming the Shockley-Queisser limit, and increasing photovoltaic yield of solar cell semiconductor substrates. Conventional solar cell semiconductor substrates have implemented organic polyacene crystals such as tetracene, pentacene, and hexacene. However, performing singlet fission in these linear acenes requires specific incident photon energy to generate the two triplet excitons. Moreover, the process for performing singlet fission is slow and inefficient, requiring long processing times that hinder and/or prevent commercialization solar cell semiconductor substrates having organic polyacene crystals.

Conventional approaches to assisting singlet fission in solar cell semiconductor substrates having pentacene has included the use of a polariton generated by a microcavity. Polaritons are a quasiparticle made up of a photon strongly coupled to an electric dipole that have a lower density state than dark states or correlated triplet pairs of the organic polyacene crystals, allowing polaritons to devolve into dark states or triplet pairs, contributing to singlet fission. Unfortunately, organic polyacene crystals of pentacene, when using a microcavity, require stringent thicknesses and lack suitable angling ability in the microcavity, limiting processability and commercialization of pentacene-based solar cell semiconductor substrates. Moreover, pentacene has a narrow absorbance compared to other linear acene compounds, further limiting the commercialization of pentacene-based solar cell semiconductor substrates.

There is a need for a new solar cell semiconductor substrate and methods of use.

SUMMARY

Aspects of the present disclosure generally relate to a solar cell semiconductor substrate and methods of use. The solar cell semiconductor substrate described herein can include a solar cell material, e.g., a polyacene compound such as hexacene, that is disposed at an angle between a first reflective layer and a second reflective layer, allowing polariton generation to occur when an incident light is introduced to the solar cell semiconductor substrate. By controlling the angle of the solar cell material disposed between the first reflective layer and the second reflective layer, a greater production of polariton formation may occur as compared to conventional semiconductor substrates. Without wishing to be bound by any theory, a greater production of polariton formation can increase the speed at which singlet fission occurs in the solar cell semiconductor substrate.

Aspects of the present disclosure can include a solar cell semiconductor substrate. The solar cell semiconductor substrate described herein can include a base, an adhesion layer disposed on the base, a first reflective layer disposed on the adhesion layer, and a second reflective layer. A solar cell material including a polyacene having at least six carbon rings is disposed between the first reflective layer and the second reflective layer. The solar cell material has a thickness that is from about 100 nm to about 500 nm.

Aspects of the present disclosure can also include a method of producing a solar cell semiconductor substrate. The method including disposing an adhesion layer on a base. A first reflective layer is disposed on the adhesion layer. A solar cell material including a polyacene having at least six carbon rings is disposed on the first reflective layer. The solar cell material includes a thickness of about 100 nm to about 500 nm. A second reflective layer is disposed on the solar cell material.

Aspects of the present disclosure can also include a method. The method including introducing a photon of solar light at a first location of a substrate. The substrate includes a base, an adhesion layer disposed on the base, a first reflective layer disposed on the adhesion layer, a second reflective layer, and a solar cell material including a polyacene having at least six carbon rings disposed between the first reflective layer and the second reflective layer. The solar cell material including a thickness of about 100 nm to about 500 nm. The method includes generating at least two excitons in the solar cell material. The at least two excitons are directed to a second location of the substrate. The second location including a material adapted to allow at least two excitons to exit the substrate.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, for the disclosure may admit to other equally effective aspects.

DETAILED DESCRIPTION

Aspects of the present disclosure generally relate to a solar cell semiconductor substrate and methods of use. The present disclosure provides a solar cell semiconductor substrate having a solar cell material, e.g., a polyacene compound such as hexacene, that is disposed between a first reflective layer and a second reflective layer, allowing for polariton generation to occur when an incident light is introduced to the solar cell semiconductor substrate. The solar cell material is disposed between the first reflective layer and the second reflective layer at an angle to provide a greater production of the polariton in the solar cell semiconductor substrate, as compared to conventional solar cell semiconductor substrates. The greater polariton production can increase the speed at which singlet fission occurs in the solar cell semiconductor substrate, allowing for increased efficiency of solar energy capture and/or utilization.

Solar Cell Semiconductor Substrate

Figure 1:
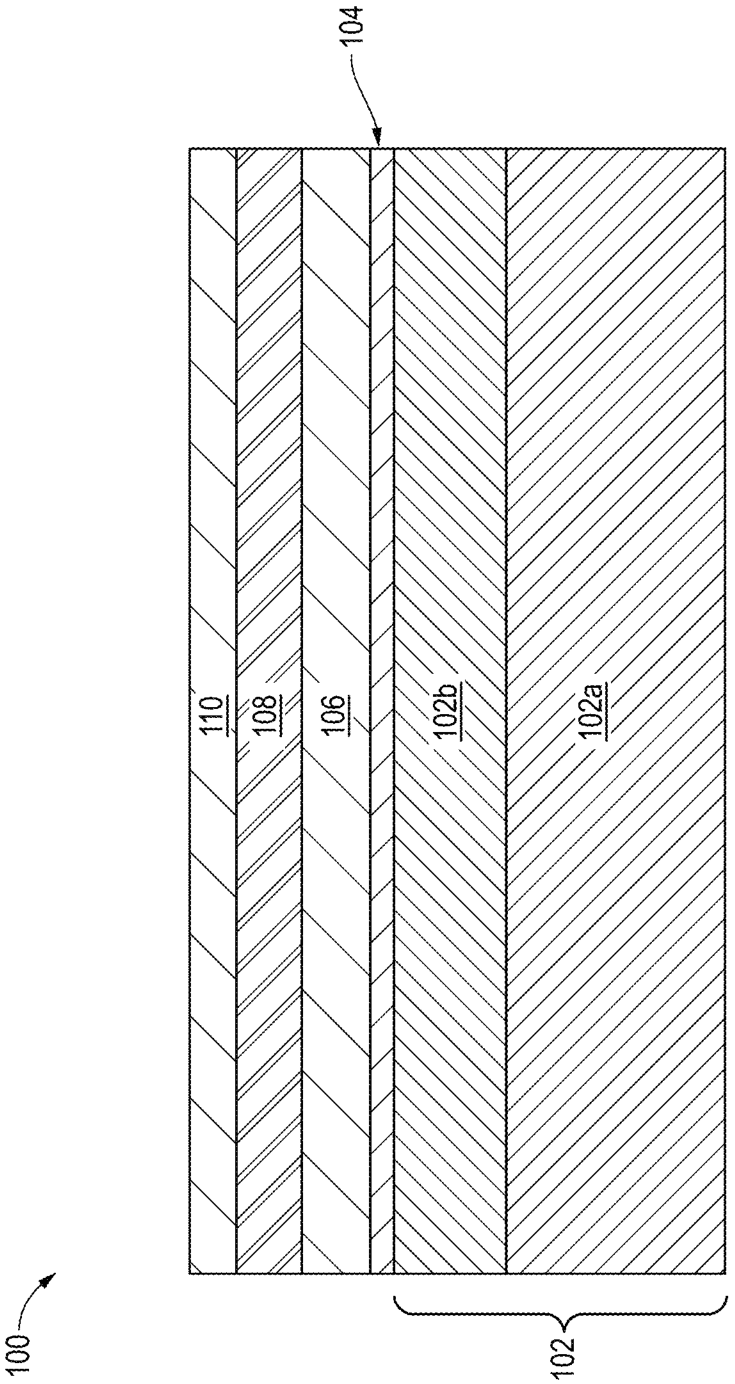
FIG. 1 shows a schematic, cross-sectional view of a solar cell semiconductor substrate according to at least one aspect of the present disclosure.

FIG. 1 shows a schematic, cross-sectional, view of a solar cell semiconductor substrate 100. The solar cell semiconductor substrate 100 includes a base 102. The base 102 can include a silicon-based material, e.g., quartz, crystalline silicon dioxide, amorphous silicon dioxide, glass, or a combination thereof. The base 102 can include a first layer 102*a* and a second layer 102*b*. The first layer 102*a* can include a silicon-based material including glass. The second layer 102*b* can include a silicon-based material including quartz. Without wishing to be bound by any theory, a base having a first layer of glass silicon dioxide and a second layer of glass can provide enhanced polariton formation.

The solar cell semiconductor substrate 100 includes an adhesion layer 104. The adhesion layer 104 can include a transition metal such as chromium, aluminum, copper, titanium, tungsten, gold, niobium, or a combination thereof. For example, the adhesion layer 104 can include a transition metal comprising chromium. In some aspects, the adhesion layer can include a thickness of about 1 nm to about 20 nm, e.g., about 1 nm to about 5 nm, about 5 nm to about 10 nm, about 10 nm to about 15 nm, or about 15 nm to about 20 nm. Without wishing to be bound by any theory, a thickness of about 1 nm to about 20 nm, can prevent peeling, delamination, and/or cracking at the interface of the adhesion layer 104 and the base 102.

A first reflective layer 106 is disposed on the adhesion layer 104. In some aspects, the first reflective layer 106 can include silver, gold, aluminum, copper, brass, bronze, platinum, titanium, stainless steel, zinc, or a combination thereof. For example, the first reflective layer 106 can include silver. The first reflective layer 106 can include a material having a reflectivity of greater than 90% of solar light, e.g., greater than 90%, greater than 91%, greater than 92%, greater than 93%, greater than 94%, greater than 95%, greater than 96%, greater than 97%, greater than 98%, or greater than 99%, where solar light can include a wavelength of about 280 nm to about 2500 nm, e.g., about 280 nm to about 300 nm, about 300 nm to about 500 nm, about 500 nm to about 1000 nm, about 1000 nm to about 1500 nm, about 1500 nm to about 2000 nm, about 2000 nm to about 2500 nm, or about 2500 nm to about 2800 nm. Additionally, the first reflective layer 106 can have a percent transmittance of less than 10% of solar light, e.g., less than 10%, less than 9%, less than 8%, less than 7%, less than 6%, less than 5%, less than 4%, less than 3%, less than 2%, or less than 1%. Without wishing to be bound by any theory, a first reflective layer 106 including a reflectivity of greater than 90% and a percent transmittance of less than 10% can increase positron generation, thereby increasing the rate of singlet fission.

In some aspects, the first reflective layer 106 can include a thickness of about 50 nm to about 200 nm, e.g., about 50 nm to about 100 nm, about 100 nm to about 150 nm, or about 150 nm to about 200 nm. Without wishing to be bound by any theory, an adhesion layer 104 providing a thickness of about 50 nm to about 200 nm can prevent peeling, delamination, and/or cracking at the interface of the adhesion layer 104 and the first reflective layer 106.

A solar cell material 108 is disposed on the first reflective layer 106. In some aspects, the solar cell material 108 can include an organic compound, e.g., a polyacene. A polyacene can include three or more carbon rings that are fused, e.g., linearly fused. For example, the polyacene includes at least six carbon rings. In at least one aspect, a polyacene can include a compound having the molecular formula of $C_{4n+2}H_{2n+4}$. For example, a polyacene compound can include anthracene, tetracene, pentacene, hexacene, heptacene, octacene, nonacene, decacene, dodecacene, phenacene, M-heptahelicene, P-heptahelicene, Benz[a]anthracene, or a combination thereof. As a further example, the polyacene compound can include hexacene. Without wishing to be bound by any theory, a larger polyacene compound, e.g., greater than $C_6H_6$, can provide greater polariton generation due to the increase conjugation of the compound, thereby providing increased singlet exciton fission rates.

In at least one aspect, the solar cell material 108 includes a thickness that is from about 100 nm to about 500 nm, e.g., from about 100 nm to about 400 nm, from about 200 nm to about 400 nm, 100 nm to about 300 nm, from about 100 nm to about 200 nm, from about 200 nm to about 300 nm, from about 300 nm to about 400 nm, or from about 400 nm to about 500 nm. Without wishing to be bound by any theory, a solar cell material 108 having a thickness of about 100 nm to about 500 nm can increase the number of reflections of the photon in the solar cell material 108, increasing the number of excitons that can be produced per photon, and thereby increasing the rate at which singlet fission occurs.

A second reflective layer 110 is disposed on the solar cell material 108. In some aspects, the second reflective layer 110 can include silver, gold, aluminum, copper, brass, bronze, platinum, titanium, stainless steel, zinc, or a combination thereof. For example, the second reflective layer 110 can include silver. The second reflective layer 110 can include a material having a reflectivity that is greater than 90% of solar light, e.g., greater than 90%, greater than 91%, greater than 92%, greater than 93%, greater than 94%, greater than 95%, greater than 96%, greater than 97%, greater than 98%, or greater than 99%, where solar light can include a wavelength that is from about 280 nm to about 2500 nm, e.g., from about 280 nm to about 1000 nm, from about 500 nm to about 1000 nm, from about 500 nm to about 1500 nm, from about 1000 nm to about 2000 nm, from about 280 nm to about 300 nm, from about 300 nm to about 500 nm, from about 500 nm to about 1000 nm, from about 1000 nm to about 1500 nm, from about 1500 nm to about 2000 nm, from about 2000 nm to about 2500 nm, or from about 2500 nm to about 2800 nm. Additionally, the second reflective layer 110 can have a percent transmittance that is less than 10% of solar light, e.g., less than 10%, less than 9%, less than 8%, less than 7%, less than 6%, less than 5%, less than 4%, less than 3%, less than 2%, or less than 1%. Without wishing to be bound by any theory, a second reflective layer 110 including a reflectivity of greater than 90% and a percent transmittance of less than 10% can increase positron generation, thereby increasing the rate of singlet fission.

In at least one aspect, the second reflective layer 110 can include a thickness that is from about 1 nm to about 50 nm, e.g., from about 1 nm to about 25 nm, from about 20 nm to about 40 nm, from about 30 nm to about 50 nm, from about 1 nm to about 10 nm, from about 10 nm to about 20 nm, from about 20 nm to about 30 nm, from about 30 nm to about 40 nm, or from about 40 nm to about 50 nm. Without wishing to be bound by any theory, a second reflective layer 110 that is thinner than the first reflective layer 106 can allow for an increased probability of photons being transmitted through the second reflective layer, e.g., photons transmitted from outside the substrate 100 into the solar cell material 108, and/or photons transmitted from within the solar cell material 108 to outside of the substrate 100.

Methods

Figure 2:
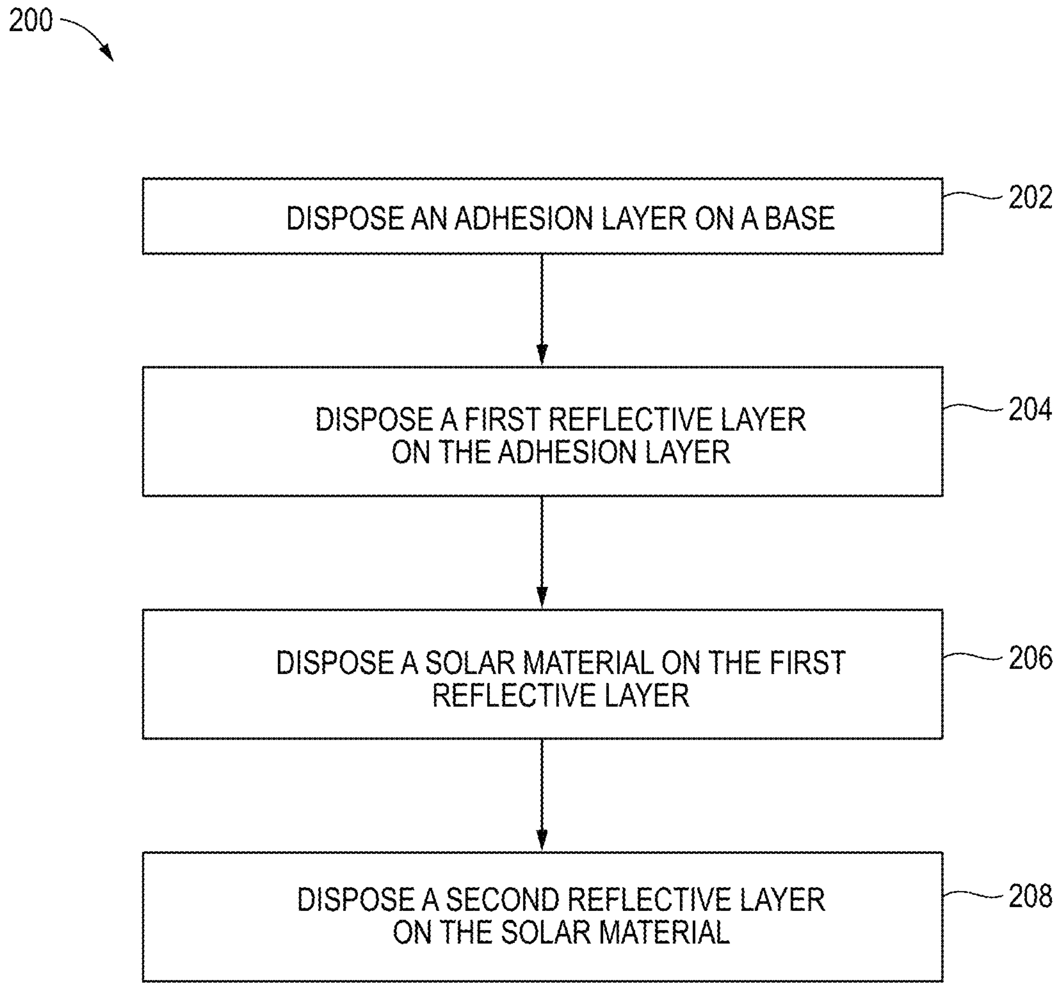
FIG. 2 shows a flowchart of a method of forming a solar cell semiconductor substrate according to at least one aspect of the present disclosure.

Now referring to FIG. 2, at operation 202, the substrate 100 can be produced by disposing an adhesion layer 104 on a base 102 in a processing chamber, where the processing chamber is not shown. In some aspects, the adhesion layer 104 can be disposed on the base 102 using a chemical vapor deposition process, where the pressure of the processing chamber can be from about $1\times10^{-7}$ Torr to about $1\times10^{-5}$ Torr, e.g., from about $1\times10^{-7}$ to about $5\times10^{-6}$, from about $5\times10^{-7}$ to about $1\times10^{-5}$, from about $1\times10^{-7}$ Torr to about $5\times10^{-7}$ Torr, from about $5\times10^{-7}$ Torr to about $1\times10^{-6}$ Torr, from about $1\times10^{-6}$ Torr to about $5\times10^{-6}$ Torr, or from about $5\times10^{-6}$ Torr to about $1\times10^{-5}$ Torr. The adhesion layer 104 can be disposed to produce a thickness that is from about 1 nm to about 20 nm, e.g., from about 1 nm to about 10 nm, from about 5 nm to about 15 nm, from about 10 nm to about 20 nm, from about 1 nm to about 5 nm, from about 5 nm to about 10 nm, from about 10 nm to about 15 nm, or from about 15 nm to about 20 nm. Without wishing to be bound by any theory, a thickness from about 1 nm to about 20 nm can prevent peeling, delamination, and/or cracking at the interface of the adhesion layer 104 and the base 102.

In at least one aspect, the base 102 can be treated prior to disposing the adhesion layer 104 on the base 102. The base 102 can be treated using one or more etchants, e.g., acids, peroxides, or a combination thereof. In some aspects, the one or more etchants can include an acid having a $pK_a$ value that is from about −10 to about 12, e.g., from about −10 to about −0, from about −9 to about 2, from about −5 to about 5, from about 0 to about 10, or from about −2 to about 12 . . . . In at least one aspect, the one or more etchants can include sulfuric acid. In some aspects, the one or more etchants can include a peroxide, e.g., 30 wt % hydrogen peroxide in water. For example, the one or more etchants can include a piranha solution having a combination of an acid and a peroxide. The piranha solution can include an acid to peroxide ratio that is from about 3:1 to about 7:1, e.g., from about 3:1 to about 6:1, from about 4:1 to about 7:1, from about 3:1 to about 4:1, from about 4:1 to about 5:1, from about 5:1 to about 6:1, or from about 6:1 to about 7:1. For example, the piranha solution can include a ratio of 3:1 sulfuric acid to 30 wt % hydrogen peroxide in water.

The base 102 can be treated by exposing the base 102 to the one or more etchants for a period of time, e.g., seconds, minutes, hours, days, weeks, or a combination thereof. For example, the base 102 can be treated for a period of time of about 2 hours to about 4 hours, e.g., 2 hours to about 3.5 hours, 2 hours to about 3 hours, 3 hours to about 4 hours, or about 2.5 hours to 3.5 hours. The treated base 102 can then be rinsed with an aqueous solution, e.g., water. The aqueous solution may be flowed over the treated base 102 for a period of time, e.g., seconds, minutes, hours, days, weeks, or a combination thereof. For example, the aqueous solution may be flowed over the treated base 102 for a period of time of about 10 minutes to about 40 minutes, e.g., about 10 minutes to about 30 minutes, about 20 minutes to about 35 minutes, about 25 minutes to about 35 minutes, or about 10 minutes to about 35 minutes. The base 102 may then be dried using one or more gases, e.g., an inert gas such as nitrogen, helium, argon, or a combination thereof to remove residual aqueous solution on the base 102. Once dried, the base 102 may be stored at a pressure that is from about 1 atm to about 1.2 atm, e.g., about 1 atm to about 1.1 atm, about 1.05 atm to about 1.15 atm, or about 1.1 atm to about 1.2 atm, in an inert gas, e.g., argon, helium, or a combination thereof, until the adhesion layer is disposed on the base 102.

At operation 204, a first reflective layer 106 is disposed on the adhesion layer 104 in the processing chamber (not shown). In some aspects, the first reflective layer 106 can be disposed on the adhesion layer 104 using a chemical vapor deposition process, where the pressure of the processing chamber can be from about $1\times10^{-7}$ Torr to about $1\times10^{-5}$ Torr, e.g., from about $1\times10^{-7}$ to about $5\times10^{-6}$, from about $5\times10^{-7}$ to about $1\times10^{-5}$, from about $1\times10^{-7}$ Torr to about $5\times10^{-7}$ Torr, from about $5\times10^{-7}$ Torr to about $1\times10^{-6}$ Torr, from about $1\times10^{-6}$ Torr to about $5\times10^{-6}$ Torr, or from about $5\times10^{-6}$ Torr to about $1\times10^{-5}$ Torr. The chemical vapor deposition process can be performed to produce a first reflective layer 106 having a thickness that is from about 50 nm to about 200 nm, e.g., from about 50 nm to about 100 nm, from about 50 nm to about 150 nm, from about 100 nm to about 200 nm, from about 50 nm to about 100 nm, from about 100 nm to about 150 nm, or from about 150 nm to about 200 nm. Without wishing to be bound by any theory, a first reflective layer having a thickness from about 50 nm to about 200 nm can prevent photons, polaritons, and/or excitons from being transmitted through the first reflective layer 106 to the adhesion layer 104.

At operation 206, a solar cell material 108 is disposed on the first reflective layer 106 in the processing chamber (not shown). In some aspects, the solar cell material can be disposed on first reflective layer 106 using a chemical vapor deposition process, where the pressure of the processing chamber can be from about $1\times10^{-7}$ Torr to about $1\times10^{-5}$ Torr, e.g., from about $1\times10^{-7}$ to about $5\times10^{-6}$, from about $5\times10^{-7}$ to about $1\times10^{-5}$, from about $1\times10^{-7}$ Torr to about $5\times10^{-7}$ Torr, from about $5\times10^{-7}$ Torr to about $1\times10^{-6}$ Torr, from about $1\times10^{-6}$ Torr to about $5\times10^{-6}$ Torr, or from about $5\times10^{-6}$ Torr to about $1\times10^{-5}$ Torr. The chemical vapor deposition process can be performed to produce a solar cell material 108 having a thickness that is from about 100 nm to about 500 nm, e.g., from about 100 nm to about 250 nm, from about 200 nm to about 400 nm, from about 150 nm to about 500 nm, from about 100 nm to about 200 nm, from about 200 nm to about 300 nm, from about 300 nm to about 400 nm, or from about 400 nm to about 500 nm.

At operation 208, a second reflective layer 110 is disposed on the solar cell material 108 in the processing chamber (not shown). In some aspects, the second reflective layer 110 can be disposed on the solar cell material 108 using a chemical vapor deposition process, where the pressure of the processing chamber can be from about $1\times10^{-7}$ Torr to about $1\times10^{-5}$ Torr, e.g., from about 10° to about 70°, from about 10° to about 60°, from about 20° to about 70°, from about 30° to about 50°, from about 50° to about 70°, from about $1\times10^{-7}$ Torr to about $5\times10^{-7}$ Torr, from about $5\times10^{-7}$ Torr to about $1\times10^{-6}$ Torr, from about $1\times10^{-6}$ Torr to about $5\times10^{-6}$ Torr, or from about $5\times10^{-6}$ Torr to about $1\times10^{-5}$ Torr. The chemical vapor deposition process can be performed to produce a second reflective layer 110 having a thickness that is from about 1 nm to about 50 nm, e.g., from about 1 nm to about 20 nm, from about 10 nm to about 40 nm, from about 20 nm to about 45 nm, from about 1 nm to about 10 nm, from about 10 nm to about 20 nm, from about 20 nm to about 30 nm, from about 30 nm to about 40 nm, or from about 40 nm to about 50 nm. Without wishing to be bound by any theory, a second reflective layer 110 that is thinner than the first reflective layer 106 can enable an increased probability of photons being transmitted through the second reflective layer, e.g., photons transmitted from outside the substrate 100 into the solar cell material 108, and/or photons transmitted from within the solar cell material 108 to outside of the substrate 100.

In operation, a photon of solar light can be introduced to the substrate 100 at a first location by transmitting through the second reflective layer 110. In some aspects, the s photon of solar light can be introduced to the substrate at an angle that is from about 1 degree (°) to about 89° relative to a normal plane of the first reflective layer 106, e.g., from about 10° to about 70°, from about 10° to about 60°, from about 20° to about 70°, from about 30° to about 50°, from about 50° to about 70°, from about 1° to about 10°, from about 10° to about 20°, from about 20° to about 30°, from about 30° to about 40°, from about 40° to about 50°, from about 50° to about 60°, from about 60° to about 70°, from about 70° to about 80°, or from about 80° to about 89°. Without wishing to be bound by any theory, an angle of about 1° to about 89° can produce a greater number of excitons by reflecting the photons in the solar cell material 108. In at least one aspect, the photon may reflect within the solar cell material, using the first reflective layer 106, the solar cell material 108, and/or the second reflective layer 110 to result in two or more excitons being generated in the solar cell material 108. The two or more excitons generated in the solar cell material 108 may reflect in the solar cell material according to the angle of the polyacene to direct the two or more excitons to a second location in the substrate 100. In at least one aspect, an increased angle may increase the reflection of the photons in the solar cell material, thereby increasing the rate at which singlet fission occurs. The two or more excitons may exit the substrate 100 at the second location via transmission through the second reflective layer 110, where the second location comprises a material adapted to allow the at least two excitons to exit through the second reflective layer 110.

EXAMPLES

Example 1

Figure 3:
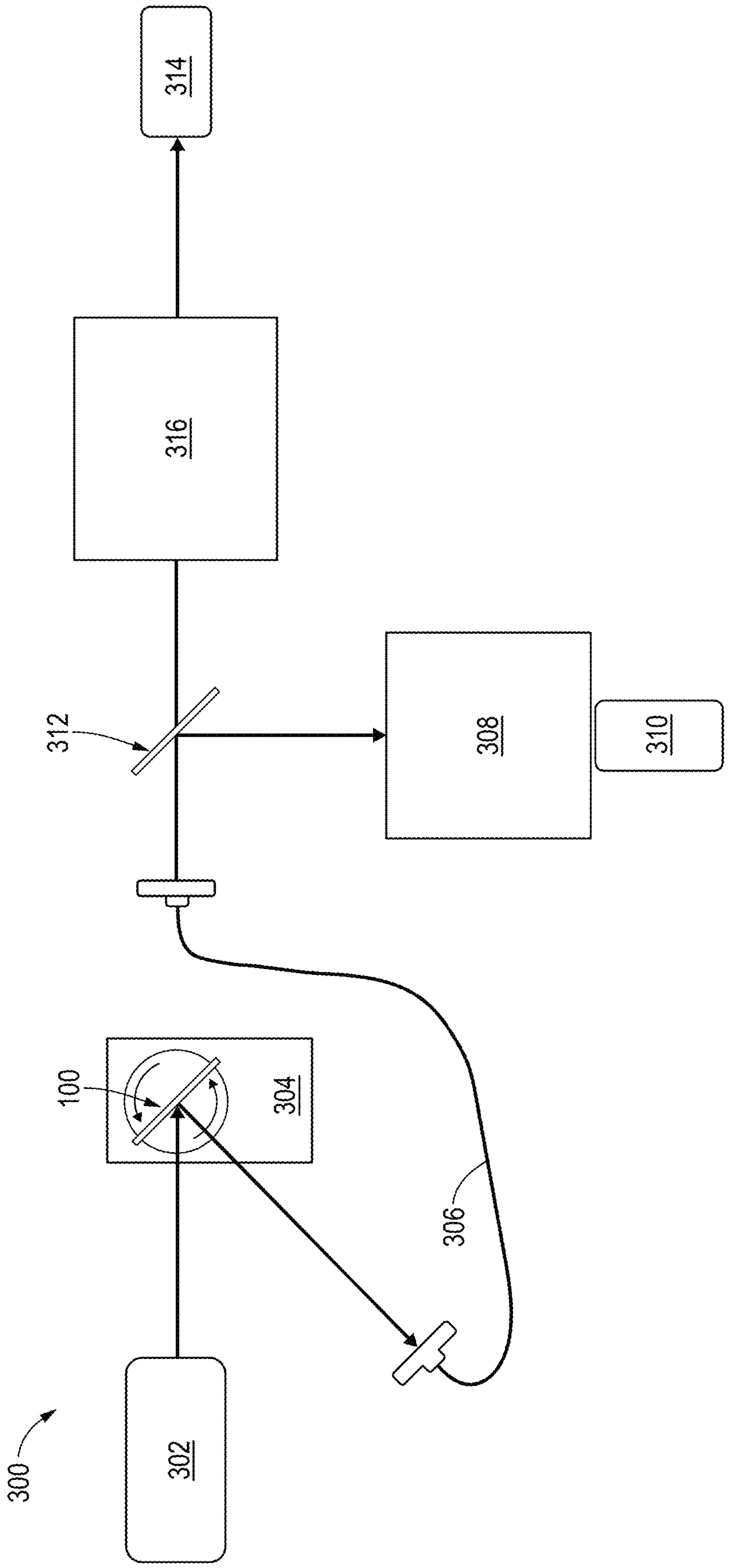
FIG. 3 shows a schematic diagram of an angle-dependent reflection spectrometer according to at least one aspect of the present disclosure.

Now referring to FIG. 3, an automated angle-dependent reflectance SWIR spectrometer 300 was used to analyze the substrate 100. A white light source 302 was focused onto the substrate 100. The substrate was placed on an electronically controlled rotation stage 304. The reflected light was then collected and focused into a fiber optic cable 306 which allowed the reflectance to be measured from 5 to 90°. The collected light was then processed by a spectrometer 308 having a charge coupled device (CCD) 310. Concurrently, the collected light was split using a beam splitter 312 and processed using an infrared (IR) detector 314 to measure the reflectance of the sample, where the detector analyzed wavelengths up to 1700 nm. The collected light was processed using a monochromator 316 and transmitted to the IR detector 314.

Figure 4:
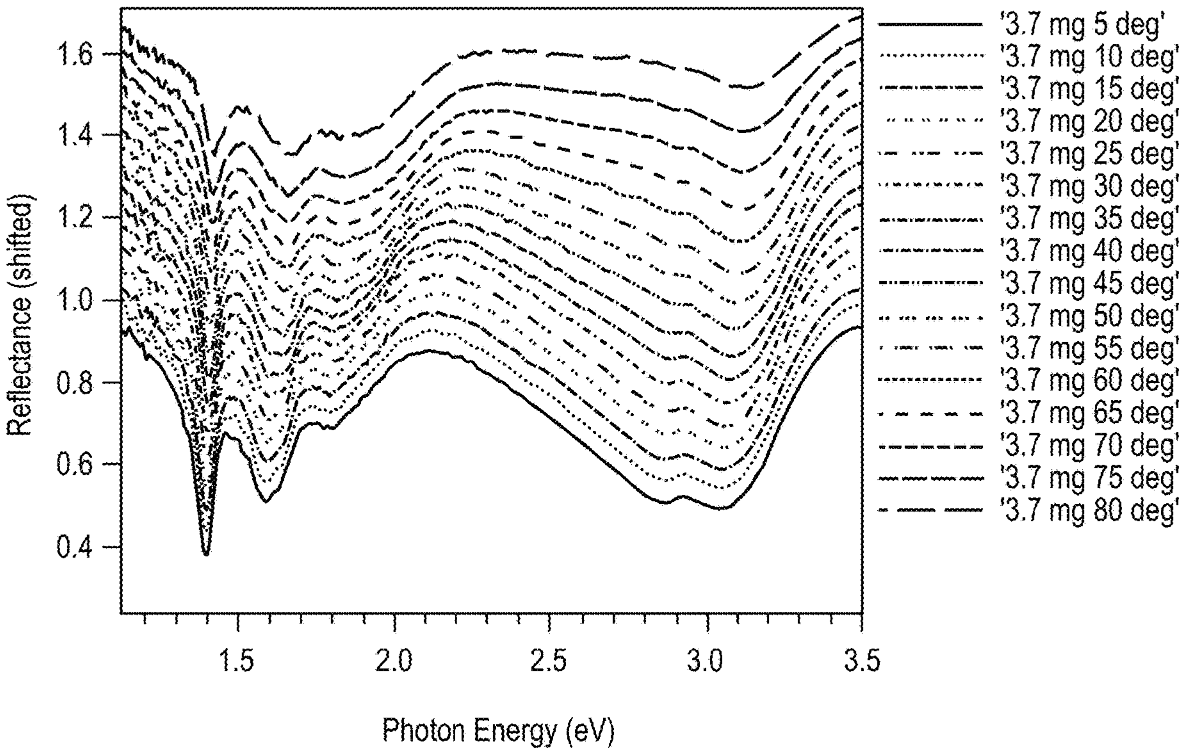
FIG. 4 shows exemplary data of an angle-dependent reflection spectra according to at least one aspect of the present disclosure.

The angle-dependence of a reflectance of the substrate was determined for a substrate having a base of silicon dioxide, a 10 nm thick adhesion layer of chromium, a 100 nm thick first reflective layer of silver, a 300 nm thick solar cell material comprising hexacene, and a 25 nm thick second reflective layer of silver. The measured reflectance spectra of angles ranging from 5° to 80° resulted in two peaks and a shoulder at lower photon energies located around 1.48, 1.52, and 1.57 eV, respectively, as shown in FIG. 4. At photon energies of greater than 2.0 eV, a bimodal peak centered near 3.0 eV. The spectra of varying angles showed that the reflectance magnitude decreased with an increasing angle, while the resolution of the spectral features increased. All the spectra indicated the presence of polaritons due to the energy range shift towards lower energies when increasing the angle.

Figure 5:
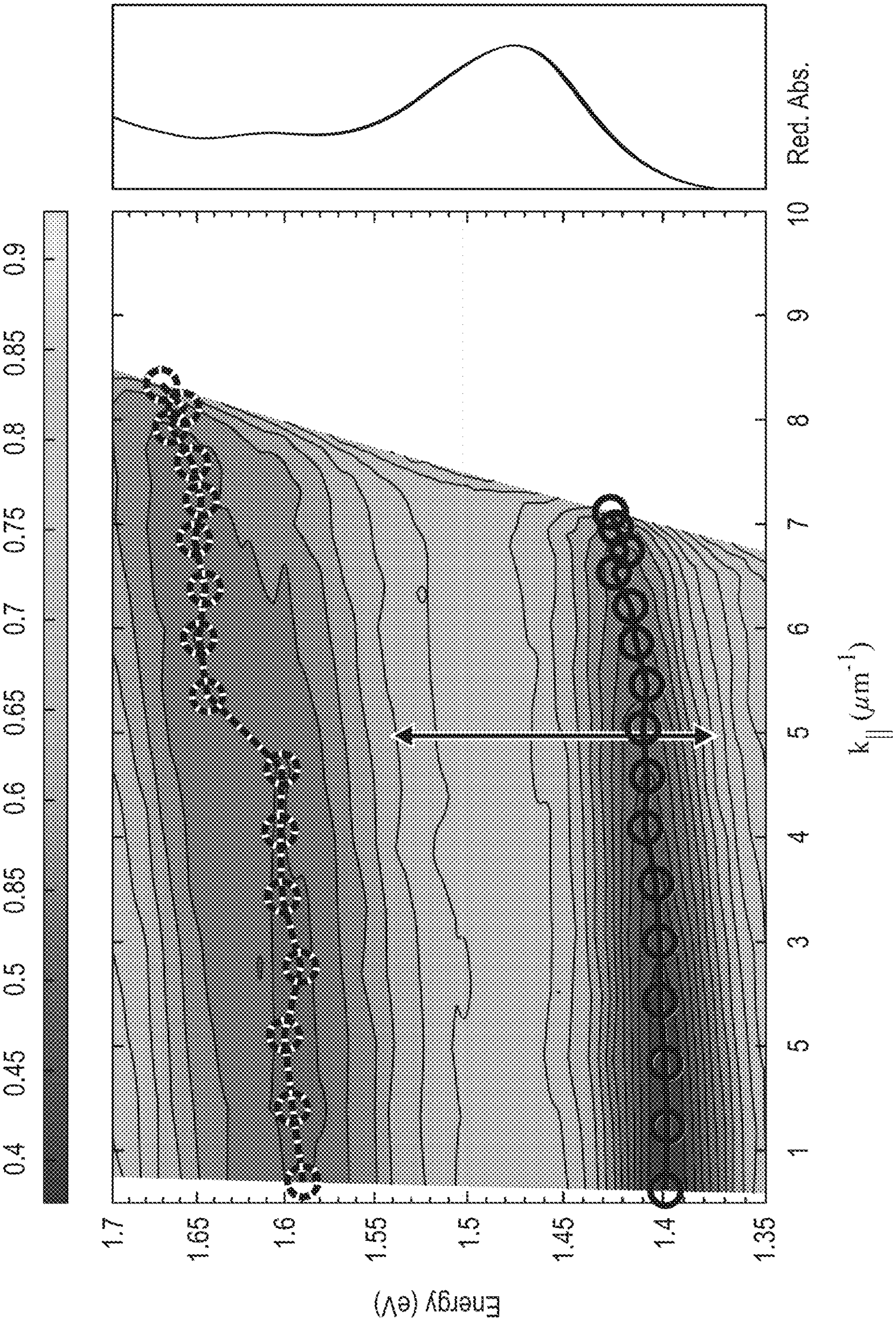
FIG. 5 shows exemplary data of a Rabi splitting spectra according to at least one aspect of the present disclosure.

The strength of the coupling between the incident photon and the generated exciton in the solar cell material was calculated using the angle-dependent absorption (A) from the experimental reflection (R) and transmission (T) spectra to determine the amount of polariton resonance. Transmission data was combined with the reflection spectra from FIG. 4 to produce FIG. 5, where the color bar is given by A=1−T−R and $$k_{\parallel} = \frac{2\pi}{\lambda}\sin\theta.$$

A redshift tor both peaks at 1.6 eV and 1.4 eV resulted, which represented $E_c$, the cavity mode energy, and $E_x$, the bare exciton energy, respectively. It was determined that amount of redshift, e.g., the rabi splitting energy "2Δ", was equal to 200 meV, where $\Delta=E_c-E_x$.

Example 2

The transient absorption of the substrate 100 was determined for a substrate having a base of silicon dioxide, a 10 nm thick adhesion layer of chromium, a 100 nm thick first reflective layer of silver, a 300 nm thick solar cell material of hexacene, and a 25 nm thick second reflective layer of silver. A reference organic semiconductor having a thin film of hexacene was also analyzed. A femtosecond laser (Lucia, UpTek) with a central wavelength of 800 nm and repetition rate of 1 kHz was used. A majority of a 4 Watt (W) pulse energy was directed toward a home-built noncolinear optical parametric amplifier (NOPA) before passing through a pulse-shaper which served as a pump on/off switch for transient reflection measurements. A 3.5 μJ pump pulse at 600 nm was directed toward the substrate after passing through an electronically controlled translation stage that controlled the delay time between the pump and probe pulses, and then passed through a neutral-density filter which reduced the pump energy to 45 nJ. The probe pulse was generated by using the homemade broadband optical parametric amplifier (BB-OPA) to produce a 1400 nm pulse, which was then upconverted to a 700 nm pulse using a beta barium borate (BBO) crystal. A quartz crystal was used to reflect a small portion of the probe pulse to be used as the reference signal. The probe pulse was directed through a cuvette containing distilled water to remove any residual longer wavelength signals, which may have been generated by the BB-OPA. The pump and probe pulses were noncolinearly focused onto the sample in a reflection geometry.

Figure 6:
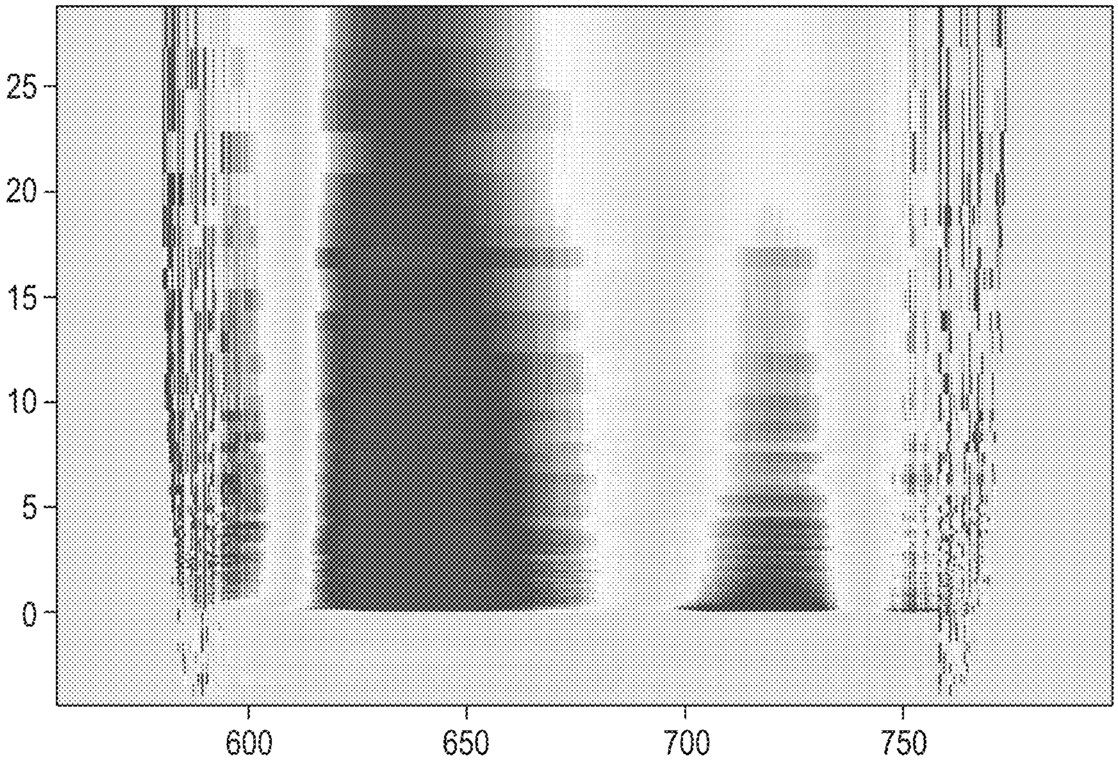
FIG. 6 shows exemplary data of a transient reflection spectra according to at least one aspect of the present disclosure.

As shown in FIG. 6, a 2D-pseudocolor plot of a transient reflection spectra of the substrate was collected. The substrate had two negative features the $T_1$-$T_n$ transition located near 600 nm, and the $S_0$-$S_1$ transition at 715 nm. Without wishing to be bound by theory, a negative feature can indicate polariton generation, in which two polariton generations occurred at 600 nm and at 715 nm.

Figure 7A:
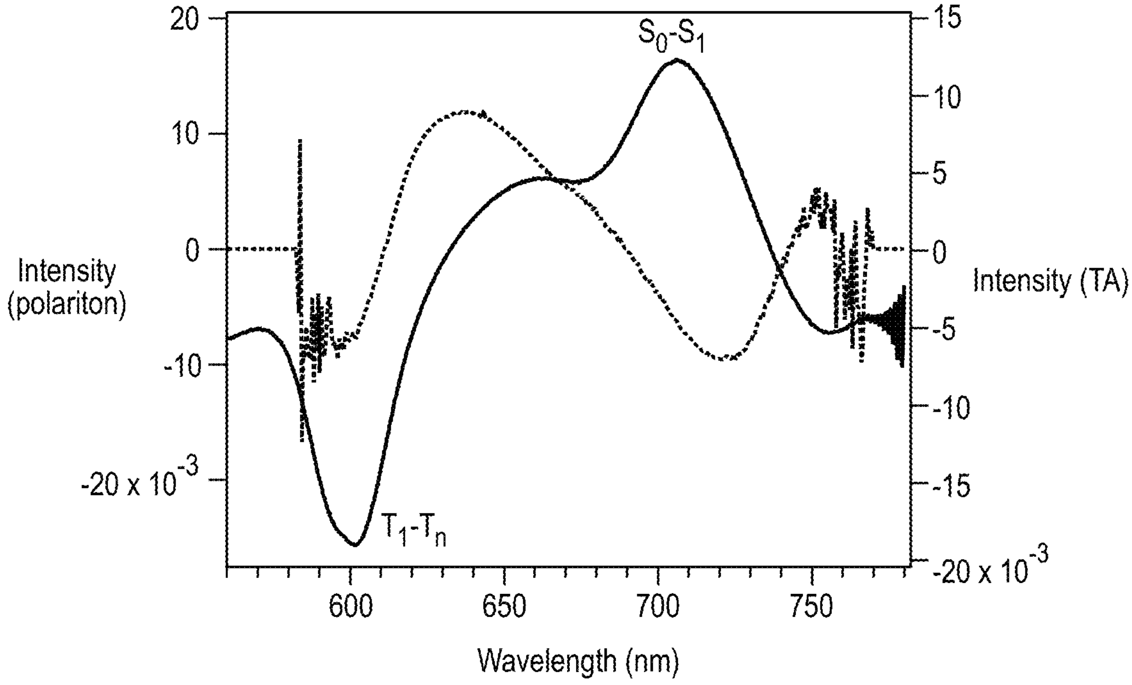
FIG. 7A shows exemplary data of a transient reflection and kinetics spectra for a hexacene thin film according to at least one aspect of the present disclosure.
Figure 7B:
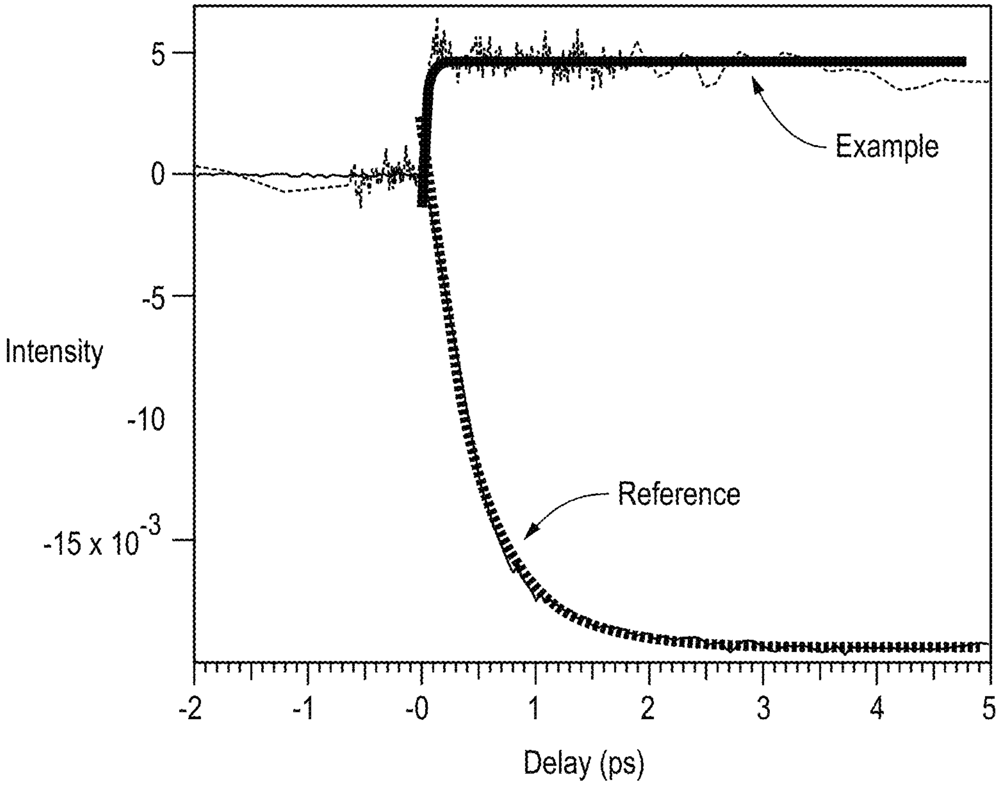
FIG. 7B shows exemplary data of a transient reflection and kinetics spectra for a hexacene microcavity according to at least one aspect of the present disclosure.

An increased singlet fission efficiency, provided by the polariton microcavity, was determined by analyzing the transient absorption and transient reflection spectra of the substrate and the reference thin film, as shown in FIGS. 7A and 7B. As shown in FIG. 7A, the transient absorption (black) and transient reflection (red) spectra of the reference thin film and the substrate at a time delay of 2 ps, respectively, were determined. The peak at 600 nm was attributed to the $T_1$-$T_n$ transition, while the peak at 715 nm was the $S_0$-$S_1$ transition. While the transient spectra for the substrate and reference thin film samples both exhibited a negative peak for the $T_1$-$T_n$ mode, the $S_0$-$S_1$ transition was positive for the reference thin film and negative for the substrate. The time traces extracted from the transient absorption (black) and transient reflection (red) were compared, as shown in FIG. 7B. The triplet transition in the substrate at the $T_1$-$T_n$ mode (e.g., 605 nm) had a shorter lifetime than that of the reference thin film. Specifically, the substrate transition occurred in 35±5 fs (blue), while the reference thin film transition occurred in 540±60 fs (green). Accordingly, multiple exciton generation occurred at the $T_1$-$T_n$ transition, increasing the rate of singlet fission in the substrate.

ASPECTS LISTING

The present disclosure provides, among others, the following aspects, each of which can be considered as optionally including any alternate aspects:

Clause 1. A solar cell semiconductor substrate, comprising: a base; an adhesion layer disposed on the base; a first reflective layer disposed on the adhesion layer; a second reflective layer; and a solar cell material comprising a polyacene having at least six carbon rings disposed between the first reflective layer and the second reflective layer, the solar cell material having a thickness that is from about 100 nm to about 500 nm.

Clause 2. The solar cell semiconductor substrate of clause 1, wherein the base comprises a silicon-based material.

Clause 3. The solar cell semiconductor substrate of any one of clauses 1-2, wherein the adhesion layer comprises a transition metal.

Clause 4. The solar cell semiconductor substrate of any one of clauses 1-3, wherein the adhesion layer comprises chromium.

Clause 5. The solar cell semiconductor substrate of any one of clauses 1-4, wherein the first reflective layer comprises a thickness that is about 100 nm to about 500 nm.

Clause 6. The solar cell semiconductor substrate of any one of clauses 1-6, wherein the second reflective layer comprises a thickness that is about 1 nm to about 50 nm.

Clause 7. The solar cell semiconductor substrate of any one of clauses 1-6, wherein the first reflective layer and the second reflective layer each comprises a reflectivity of greater than 90% of solar light.

Clause 8. The solar cell semiconductor substrate of clause 7, wherein the first reflective layer comprises silver.

Clause 9. The solar cell semiconductor substrate of clause 7, wherein the second reflective layer comprises silver.

Clause 10. The solar cell semiconductor substrate any one of clauses 1-9, wherein the polyacene is oriented at an angle of about 1° to about 89°.

Clause 11. A method of producing a solar cell semiconductor substrate, the method comprising: disposing an adhesion layer on a base; disposing a first reflective layer on the adhesion layer; disposing a solar cell material comprising a polyacene having at least six carbon rings on the first reflective layer, wherein the solar cell material comprises a thickness of about 100 nm to about 500 nm; and disposing a second reflective layer on the solar cell material.

Clause 12. The method of clause 11, wherein, prior to disposing the adhesion layer on the base, the method further comprises: treating the base using one or more etchants; rinsing the base using an aqueous solution; and drying the base using one or more gases.

Clause 13. The method of clause 12, wherein the one or more etchants comprise an acid, a peroxide, or combinations thereof.

Clause 14. The method of clause 13, wherein when the one or more etchants comprises the acid, the acid comprises sulfuric acid.

Clause 15. The method of clause 13, wherein when the one or more etchants comprises the peroxide, the peroxide comprises hydrogen peroxide.

Clause 16. The method of clause 12, wherein the polyacene comprises hexacene.

Clause 17. The method of clause 12, wherein the one or more gases comprises an nitrogen, helium, argon, or combinations thereof.

Clause 18. The method of any one of clauses 11-17, wherein disposing the solar cell material comprising the polyacene on the first reflective layer comprises performing a chemical vapor deposition process.

Clause 19. A method, comprising: introducing a photon of solar light at a first location of a substrate, the substrate comprising: a base; an adhesion layer disposed on the base; a first reflective layer disposed on the adhesion layer; a second reflective layer; and a solar cell material comprising a polyacene having at least six carbon rings disposed between the first reflective layer and the second reflective layer, the solar cell material comprising a thickness of about 100 nm to about 500 nm; generating at least two excitons in the solar cell material; and directing the at least two excitons to a second location of the substrate, the second location comprising a material adapted to allow at least two excitons to exit the substrate.

Clause 20. The method of clause 19, wherein generating the at least two excitons comprises introducing the photon to the polyacene and forming the at least two excitons using singlet fission As is apparent from the foregoing general description and the specific aspects, while forms of the aspects have been illustrated and described, various modifications can be made without departing from the spirit and scope of the present disclosure. Accordingly, it is not intended that the present disclosure be limited thereby. Likewise, the term “comprising” is considered synonymous with the term “including.” Likewise whenever a composition, an element or a group of elements is preceded with the transitional phrase “comprising,” it is understood that we also contemplate the same composition or group of elements with transitional phrases “consisting essentially of,” “consisting of,” “selected from the group of consisting of,” or “Is” preceding the recitation of the composition, element, or elements and vice versa, for example, the terms “comprising,” “consisting essentially of,” “consisting of” also include the product of the combinations of elements listed after the term.

The use of headings is for purposes of convenience only and does not limit the scope of the present disclosure.

For purposes of this present disclosure, and unless otherwise specified, all numerical values within the detailed description and the claims herein are modified by “about” or “approximately” the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the term "about" when referring to a measurable value such as an amount, a temporal duration, and the like, is meant to encompass variations of ±20%, ±15, ±10%, ±5%, ±1%, or ±0.1% from the specified value, as such variations are appropriate.

As used herein, the indefinite article "a" or "an" shall mean "at least one" unless specified to the contrary or the context clearly indicates otherwise. For example, aspects comprising "a metal" include aspects comprising one, two, or more metals, unless specified to the contrary or the context clearly indicates only one metal is included.

While the foregoing is directed to aspects of the present disclosure, other and further aspects of the disclosure may be devised without departing from the basic scope thereof, and the scope thereof is determined by the claims that follow.

What is claimed is:

1. A solar cell semiconductor substrate, comprising:

a base;

an adhesion layer disposed on the base;

a first reflective layer disposed on the adhesion layer;

a second reflective layer; and a solar cell material comprising a polyacene having at least six fused carbon rings disposed between the first reflective layer and the second reflective layer and disposed at an angle between the first reflective layer and the second reflective layer, wherein the solar cell material having a thickness that is from about 100 nm to about 400 nm, wherein the base comprises a silicon-based material, and wherein the adhesion layer comprises a transition metal.

2. The solar cell semiconductor substrate of claim 1, wherein the silicon-based material is selected from the group consisting essentially of quartz, crystalline silicon dioxide, amorphous silicon dioxide, glass, and combinations thereof.

3. The solar cell semiconductor substrate of claim 1, wherein the adhesion layer is selected from the group consisting essentially of chromium, aluminum, copper, titanium, tungsten, gold, niobium, or a combination thereof.

4. The solar cell semiconductor substrate of claim 1, wherein the adhesion layer comprises chromium.

5. The solar cell semiconductor substrate of claim 4, wherein the adhesion layer comprises a thickness of about 1 nm to about 20 nm.

6. The solar cell semiconductor substrate of claim 1, wherein the first reflective layer comprises a thickness that is about 100 nm to about 500 nm.

7. The solar cell semiconductor substrate of claim 1, wherein the second reflective layer comprises a thickness that is about 1 nm to about 50nm.

8. The solar cell semiconductor substrate of claim 1, wherein the first reflective layer and the second reflective layer each comprises a reflectivity of greater than 90% of solar light.

9. The solar cell semiconductor substrate of claim 8, wherein the first reflective layer and the second reflective layer each separately comprise silver, gold, aluminum, copper, brass, bronze, platinum, titanium, stainless steel, zinc, or a combination thereof.

10. The solar cell semiconductor substrate of claim 8, wherein the first reflective layer and the second reflective layer comprise silver.

* * * * *